(12) United States Patent
Qin et al.

(10) Patent No.: US 12,148,867 B2
(45) Date of Patent: Nov. 19, 2024

(54) LIGHT-EMITTING DEVICE AND DISPLAYER

(71) Applicant: FOSHAN NATIONSTAR OPTOELECTRONICS CO., LTD, Foshan (CN)

(72) Inventors: Kuai Qin, Guangdong (CN); Heng Guo, Guangdong (CN); Xiaobo Ouyang, Guangdong (CN); Hongwen Chen, Guangdong (CN); Qiang Zhao, Guangdong (CN); Bin Cai, Guangdong (CN); Nianpu Li, Guangdong (CN); Junyong Wang, Guangdong (CN)

(73) Assignee: FOSHAN NATIONSTAR OPTOELECTRONICS CO., LTD, Foshan (CN)

( * ) Notice: Subject to any disclaimer, the term of this patent is extended or adjusted under 35 U.S.C. 154(b) by 365 days.

(21) Appl. No.: 17/574,586

(22) Filed: Jan. 13, 2022

(65) Prior Publication Data
US 2022/0231206 A1  Jul. 21, 2022

(30) Foreign Application Priority Data

Jan. 15, 2021 (CN) .......................... 202120105789.2
May 25, 2021 (CN) .......................... 202110572473.9

(51) Int. Cl.
*H01L 33/56* (2010.01)
*H01L 23/00* (2006.01)
(Continued)

(52) U.S. Cl.
CPC .............. *H01L 33/56* (2013.01); *H01L 24/11* (2013.01); *H01L 24/13* (2013.01); *H01L 24/32* (2013.01);
(Continued)

(58) Field of Classification Search
CPC ......... H01L 33/52–56; H01L 2933/005; H01L 2933/0025; H01L 33/44;
(Continued)

(56) References Cited

U.S. PATENT DOCUMENTS 5,081,520 A * 1/1992 Yoshii ................. H01L 23/3121
257/E23.125
2011/0215365 A1* 9/2011 Lin ....................... H01L 21/568
257/E33.059
(Continued)

FOREIGN PATENT DOCUMENTS

CN          205029966 U     2/2016
CN          106384720 A     2/2017
(Continued)

*Primary Examiner* — Mohammad A Rahman
*Assistant Examiner* — Eric Manuel Mulero Flores
(74) *Attorney, Agent, or Firm* — Samson G. Yu

(57) ABSTRACT

The disclosure provides a light-emitting device and a displayer. Herein, the light-emitting device includes a substrate, a light-emitting chip, a first light-transmitting layer, a second light-transmitting layer and a nano coating. The light transmittance of the second light-transmitting layer is greater than the light transmittance of the first light-transmitting layer. A reference surface corresponding to the light-emitting chip is arranged above the substrate, and the reference surface is higher than the bottom surface of the light-emitting chip and not higher than the top surface of the light-emitting chip. The first light-transmitting layer covers the surface of the light-emitting chip below the reference surface, and the second light-transmitting layer covers the surface of the light-emitting chip above the reference surface. The nano coating covers the outer surface of the first light-transmitting layer, the outer surface of the second light-transmitting layer and the side surface of the substrate.

17 Claims, 6 Drawing Sheets

(51) Int. Cl.
*H01L 25/075* (2006.01)
*H01L 33/62* (2010.01)

(52) U.S. Cl.
CPC .......... *H01L 24/81* (2013.01); *H01L 25/0753* (2013.01); *H01L 33/62* (2013.01); *H01L 24/16* (2013.01); *H01L 24/48* (2013.01); *H01L 24/73* (2013.01); *H01L 2224/10155* (2013.01); *H01L 2224/11013* (2013.01); *H01L 2224/1134* (2013.01); *H01L 2224/1182* (2013.01); *H01L 2224/1357* (2013.01); *H01L 2224/13609* (2013.01); *H01L 2224/13611* (2013.01); *H01L 2224/13613* (2013.01); *H01L 2224/13616* (2013.01); *H01L 2224/13617* (2013.01); *H01L 2224/1362* (2013.01); *H01L 2224/13639* (2013.01); *H01L 2224/13647* (2013.01); *H01L 2224/13655* (2013.01); *H01L 2224/16227* (2013.01); *H01L 2224/32238* (2013.01); *H01L 2224/48227* (2013.01); *H01L 2224/73204* (2013.01); *H01L 2224/81007* (2013.01); *H01L 2224/81192* (2013.01); *H01L 2224/81815* (2013.01); *H01L 2924/01032* (2013.01); *H01L 2924/12041* (2013.01)

(58) Field of Classification Search
CPC ............... H01L 2224/13001–13499; H01L 21/02428–0243; H01L 23/12–13; H01L 2224/1012–10175; H01L 2224/81–81986; B23K 20/004
See application file for complete search history.

(56) References Cited

U.S. PATENT DOCUMENTS

| | | | |
|---|---|---|---|
| 2014/0063764 A1* | 3/2014 | Tanaka | H05K 1/186 361/764 |
| 2014/0291843 A1 | 10/2014 | Jiang et al. | |
| 2016/0211425 A1* | 7/2016 | Tsujimoto | H01L 33/22 |
| 2017/0164473 A1* | 6/2017 | Denda | H01L 23/5384 |
| 2017/0221829 A1* | 8/2017 | Shiraki | H01L 21/565 |
| 2021/0358861 A1* | 11/2021 | Neumann | C09D 11/037 |
| 2021/0375707 A1* | 12/2021 | Teixeira De Queiros | H01L 23/315 |

FOREIGN PATENT DOCUMENTS

| | | | |
|---|---|---|---|
| CN | 210403768 U | * | 4/2020 |
| CN | 112687556 A | | 4/2021 |
| CN | 112701108 A | | 4/2021 |
| JP | 1991291950 A | | 12/1991 |
| JP | 1995106750 A | | 4/1995 |
| JP | H08288291 A | | 11/1996 |
| WO | 9701866 A1 | | 1/1997 |

* cited by examiner

LIGHT-EMITTING DEVICE AND DISPLAYER

CROSS-REFERENCE TO RELATED PRESENT INVENTION(S)

The disclosure claims priority to and the benefit of Chinese Patent Present invention No. 202120105789.2 and No. 202110572473.9, filed in the China National Intellectual Property Administration (CNIPA) on 15 Jan. 2021 and 25 May 2021, which are incorporated herein by reference in its entirety.

TECHNICAL FIELD

The disclosure relates to the technical field of light-emitting devices, in particular to a light-emitting device and a displayer.

BACKGROUND

Considering the cost, an existing light-emitting device usually only selects one kind of packaging colloid to package a light-emitting chip on a substrate to meet the protection requirements of the light-emitting chip. The light transmittance difference of the packaging colloid will affect the overall performance of the light-emitting device. If the light transmittance of the packaging colloid is high, the problem of light crosstalk is prone to occurring when the light-emitting device is used, resulting in the decrease of resolution and contrast of the light-emitting device. If the light transmittance of the packaging colloid is low, although the resolution and contrast of the light-emitting device may be improved, the overall brightness of the light-emitting device will be correspondingly reduced, so it is difficult to meet the use requirements.

SUMMARY

In order to balance the light-emitting intensity and resolution of a light-emitting device, the disclosure provides a light-emitting device. Through the arrangement of a double-layer light-transmitting layer, the light-emitting device reduces lateral crosstalk of the light-emitting device, so as to improve the resolution of the light-emitting device, ensures the light-emitting intensity of the light-emitting device, and has good comprehensive performance.

Correspondingly, the disclosure provides a light-emitting device, which may include a substrate and a light-emitting chip. The light-emitting chip is arranged on the substrate in a bonding mode. The light-emitting device may further include a first light-transmitting layer, a second light-transmitting layer and a nano coating. The light transmittance of the second light-transmitting layer is greater than the light transmittance of the first light-transmitting layer.

A reference surface corresponding to the light-emitting chip is arranged above the substrate, and the reference surface is higher than the bottom surface of the light-emitting chip and the reference surface is not higher than the top surface of the light-emitting chip.

An exposed surface of the light-emitting chip is divided into an upper surface and a lower surface based on the reference surface.

The lower surface is covered by the first light-transmitting layer, and the upper surface is covered by the second light-transmitting layer.

The first light-transmitting layer and the second light-transmitting layer are closely arranged at a position of the reference surface.

The nano coating covers the outer surface of the first light-transmitting layer, the outer surface of the second light-transmitting layer and the side surface of the substrate.

According to an implementation mode, the thickness of the nano coating ranges from [150 nm, 30000 nm].

According to an implementation mode, the roughness value of the nano coating ranges from [2.7, 3.2].

In an implementation mode, the light-emitting chip is a flip-chip. The light-emitting chip is provided with an electrode located at the bottom of the light-emitting chip, the light-emitting chip is bonded to the substrate based on the corresponding electrode, and the lower surface includes the bottom surface of the light-emitting chip and the side surface, located below the reference surface, of the light-emitting chip.

Or, the light-emitting chip is a front-mounted chip. The bottom surface of the light-emitting chip is attached to the substrate, and the lower surface includes the side surface, located below the reference surface, of the light-emitting chip.

According to an implementation mode, when the light-emitting chip is the flip-chip, the substrate bulges at a position corresponding to the electrode to form a boss, and the electrode is bonded to the corresponding boss.

According, to an implementation mode, when the light-emitting chip is the front-mounted chip, the substrate bulges at a position corresponding to the light-emitting chip to form a boss, and the bottom surface of the light-emitting chip is attached to the boss.

According to an implementation mode, the number of the light-emitting chips is more than two.

All the light-emitting chips share one layer of the first light-transmitting layer, and/or all the light-emitting chips share one layer of the second light-transmitting layer.

According to an implementation mode, the heights of the light-emitting chips in one light-emitting device are not exactly the same.

The height of the first light-transmitting layer is not higher than the top surface of the light-emitting chip with the lowest height in the light-emitting device.

According to an implementation mode, the height of the light-emitting chip is H, and the height of the reference surface corresponding to the light-emitting chip is h. Herein H≥h≥3H/4.

According to an implementation mode, the light-emitting device is formed by cutting a module.

According to an implementation mode, the module includes a circuit board, a plurality of the light-emitting chips and a packaging material. Herein, the substrate of the light-emitting device is at least a part of the circuit board, the light-emitting chip of the light-emitting device is at least one of a plurality of the light-emitting chips of the module, and the first light-transmitting layer, the second light-transmitting layer and the nano coating of the light-emitting device are at least a part of the packaging material of the module.

According to an implementation mode, the circuit board is provided with a bonding pad, and the light-emitting chip is provided with an electrode. The electrode is bonded to the corresponding bonding pad based on a connection structure. The connection structure includes a connection ball and solder. The connection ball is bonded to the bonding pad, the solder covers the connection ball and the bonding pad, and the electrode is bonded with the corresponding connection ball and the bonding pad through the solder. The packaging material covers the light-emitting chip and encapsulates the light-emitting chip on the circuit board.

According to an implementation mode, the connection structure further includes a reinforcing wire, and both ends of the reinforcing wire are respectively bonded to the corresponding connection ball and the bonding pad.

According to an implementation mode, the periphery of the electrode of the light-emitting chip is provided with a metal layer and an insulating layer. The metal layer is arranged on the peripheral side of the electrode of the light-emitting chip in a surrounding mode and contacts the electrode of the light-emitting chip, and the insulating layer is arranged on the outer side wall of the metal layer in a surrounding mode.

According to an implementation mode, the arrangement height of the metal layer is higher than the arrangement height of the electrode of the light-emitting chip, and the arrangement height of the metal layer is flush with the arrangement height of the insulating layer.

According to an implementation mode, the metal layer surrounds the corresponding bonding pad.

According to, an implementation mode, the ratio of the maximum cross-sectional area of the connection ball to the area of the bonding pad ranges from [0.105, 0.655].

According to an implementation mode, the number of the reinforcing wires is at least two.

Correspondingly, the disclosure also provides a displayer, which includes the above-mentioned light-emitting device.

In conclusion, the disclosure provides a light-emitting device and a displayer. The light-emitting device ensures the light-emitting intensity of the light-emitting chip as much as possible, and has good comprehensive performance while reducing the light crosstalk of the light-emitting device and improving the resolution and contrast of the light-emitting device through the arrangement of the two light-transmitting layers and the difference arrangement of the light transmittance of the two light-transmitting layers. The nano coating and the boss structure are arranged so that the anti-impurity-intrusion performance of the light-emitting device can be ensured, and the service life of the light-emitting device is improved. The displayer using the light-emitting device has the advantages of high contrast, high resolution, high brightness, etc.

REFERENCE SIGNS 101, nano-coating; 102, second light-transmitting layer; 103, light-emitting chip; 104, first light-transmitting layer; 105, electrode; 106, solder; 107, electrode boss; 108, substrate; 202, chip boss; 301, integral boss; 1, circuit board; 2, bonding pad; 3, connection ball; 4, reinforcing wire; 8, metal layer; 9, insulating layer; and 10, packaging material.

DETAILED DESCRIPTION OF THE EMBODIMENTS

Clear and complete descriptions will be made on technical solutions in the embodiments of the disclosure below in combination with drawings in the embodiments of the disclosure. It is apparent that the described embodiments are only a part rather than all of embodiments of the disclosure. All other embodiments obtained by those of ordinary skill in the art based on the embodiments in the disclosure without creative work shall fall within the scope of protection of the disclosure.

In order to give a complete explanation of the disclosure, the content of the disclosure will be described from several angles, such as a module processing method, the structure of a module, and a light-emitting device obtained after module division.

In the disclosure, the light-emitting device is formed by cutting the module, and any light-emitting device is provided with at least one light-emitting chip. Herein, a substrate of the light-emitting device is at least a part of a circuit board. The light-emitting chip of the light-emitting device is at least one of a plurality of the light-emitting chips of the module. A first light-transmitting layer, a second light-transmitting layer and a nano coating of the light-emitting device are at least a part of a packaging material of the module.

In order to further explain the structure of the light-emitting device in detail, the following description will be made with reference to FIGS. 1 to 3.

Figure 1:
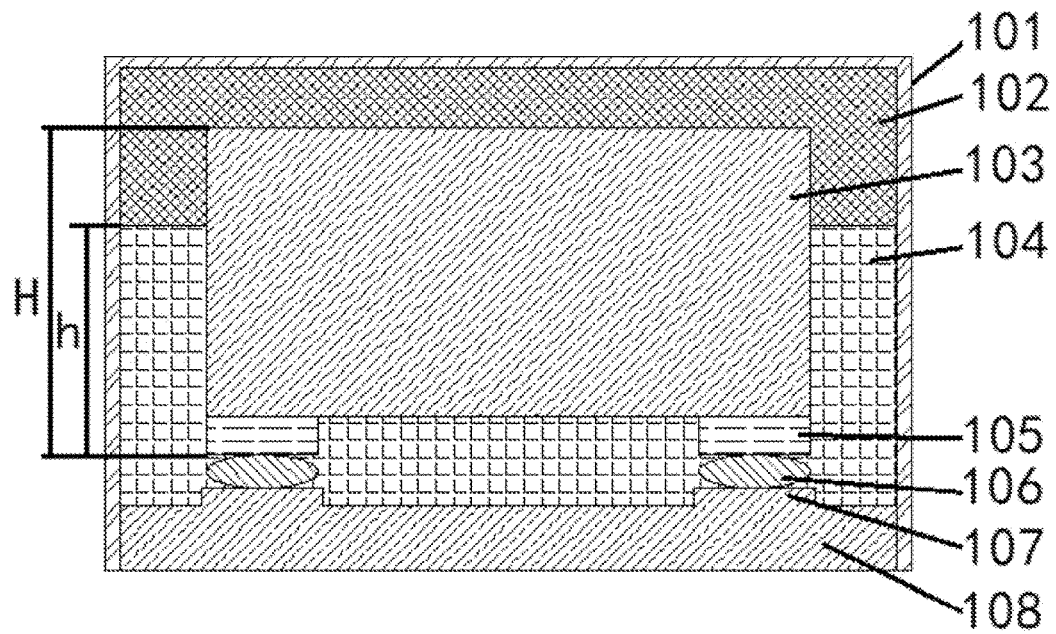
FIG. 1 is a cross-sectional structural diagram of a light-emitting device using a flip-chip in the disclosure.

FIG. 1 is a cross-sectional structural diagram of a light-emitting device using a flip-chip in the disclosure.

The implementation mode of the disclosure provides a light-emitting device, which includes a substrate 108 and a light-emitting chip 103. The light-emitting chip 103 is arranged on the substrate 108 in a bonding mode. Specifically, aimed at different types of the light-emitting chips 103, the bonding forms of the light-emitting chips 103 are different.

Furthermore, the light-emitting device further includes a first light-transmitting layer 104 and a second light-transmitting layer 102. The light transmittance of the second light-transmitting layer 102 is greater than the light transmittance of the first light-transmitting layer 104. A reference surface (the reference surface is the interface of the first light-transmitting layer 104 and the second light-transmitting layer 102) corresponding to the light-emitting chip 103 is arranged above the substrate 108. The reference surface is higher than the bottom surface of the light-emitting chip 103 and the reference surface is not higher than the top surface of the light-emitting chip 103. An exposed surface of the light-emitting chip 103 is divided into an upper surface and a lower surface based on the reference surface. The lower surface is covered by the first light-transmitting layer 104, and the upper surface is covered by the second light-transmitting layer 102. The first light-transmitting layer 104 and the second light-transmitting layer 102 are closely arranged at a position of the reference surface. Specifically, the implementation mode has the beneficial effects that, for the light-emitting chip 103 with a general structure, the light-emitting intensity of the light-emitting chip 103 decreases with the increase of the angle, and the crosstalk of the light-emitting device and the reduction of the resolution of the light-emitting device are mainly caused by the light emitted by the light-emitting chip 103 at a large angle. Therefore, the implementation mode of the disclosure covers the surface of the light-emitting chip 103 below the reference surface with the first light-transmitting layer 104, which may reduce the amount of light emitted by the light-emitting chip 103 at a large angle, reduce the crosstalk and increase the resolution of the light-emitting device. Meanwhile, the surface of the light-emitting chip 103 above the reference surface is covered with the second light-transmitting layer 102, which can ensure that the light emitted from an area with higher light-emitting intensity of the light-emitting chip 103 emitted as much as possible, and reduce the absorption of light by the light-transmitting layer.

Further, if the height of the light-emitting chip 103 is H, the height h of the reference surface is preferably H≥h≥3H/4.

In specific implementation, the first light-transmitting layer 104 and the second light-transmitting layer 102 may be made of the same matrix colloid material, such as epoxy resin and other materials, so as to ensure the tight combination between the first light-transmitting layer 104 and the second light-transmitting layer 102. In order to form the light transmittance difference between the first light-transmitting layer 104 and the second light-transmitting layer 102, a certain amount of carbon black may be infiltrated into the material of the first light-transmitting layer 104 to meet the light transmittance requirement.

Specifically, in order to meet the anti-impurity requirement of the light-emitting device and improve the service life of the light-emitting device, optionally, other surfaces of the light-emitting device except the bottom surface of the light-emitting device are covered by the nano coating 101.

The nano coating 101 is formed by spraying nano paint, and is an integral structure after molding. On the one hand, due to the small size of the material particles of nano material, and the tight combination among the material particles, the gap among particles is small, and the nano coating 101 formed by the nano material has excellent anti-impurity performance. On the other hand, the nano coating 101 seals a bonding surface between the first light-transmitting layer 104 and the second light-transmitting layer 102 and a bonding surface between the first light-transmitting layer 104 and the substrate 108, so as to prevent impurities from invading the light-emitting chip 103 from a relatively easy invading position, reduce the failure probability of the light-emitting chip 103, and improve the service life of the light-emitting device.

Specifically, the thickness of the nano coating ranges from [150 nm, 30000 nm], and/or the roughness value of the nano coating ranges from [2.7, 3.2]. When the thickness of the nano coating is less than 150 nm, the waterproof ability is weak. When the thickness of the nano coating is greater than 30000 nm, there is a certain rate that the nano coating will be brought up during a scraping process in the manufacturing process of the light-emitting device, which does not facilitate the manufacturing of the light-emitting device. Furthermore, when the surface roughness of the nano coating is less than 2.7, the surface of the light-emitting device after being manufactured will reflect light, which affects the visual effect. When the surface roughness of the nano coating is greater than 3.2, the resolution of the light-emitting device will easily decrease due to too high roughness.

Specifically, the light-emitting chip 103 in the implementation mode of the disclosure adopts a flip-chip, the light-emitting chip 103 is provided with an electrode 105 at the bottom, and the light-emitting chip 103 is bonded to the substrate 108 based on the corresponding electrode 105. Specifically, the substrate 108 is provided with a bonding pad at a position corresponding to the electrode 105, which is not shown in the drawing. Correspondingly, the side surface of the light-emitting chip 103 located below the reference surface and the bottom surface of the light-emitting chip 103 are covered by the first light-transmitting layer 104.

Specifically, in order to further increase the difficulty of impurity intrusion into the light-emitting chip 103, the substrate 108 bulges at the position corresponding to the electrode 105 to form a boss, and the electrode 105 is bonded to the corresponding boss, so that the difficulty of impurity intrusion into the light-emitting chip 103 is increased under the action of gravity. Specifically, for the sake of distinguishing, the boss in the implementation mode of the disclosure is named as an electrode boss 107.

Correspondingly, the first light-transmitting layer 104 can cover the electrode boss 107. Since the electrode boss 107 may be provided with a corresponding bonding pad structure and the metal surface on the bonding pad structure may have certain metallic luster, the leakage area of the metal surface can be reduced by covering same with the first light-transmitting layer 104, thus reducing the reflection amount of light from the metal surface, increasing the blackness of the light-emitting device, and reducing the influence of the metallic luster light reflected by the metal surface on the resolution of the light-emitting device. The purpose of improving the contrast of the light-emitting device is implemented on the premise that the light intensity at the top of the light-emitting chip is almost the same.

It is to be noted that an ellipse in the figure is used to indicate the solder 106. The solder 106 also has metallic luster, and the first light-transmitting layer 104 may also play a role in reducing the luster of the solder 106.

Figure 2:
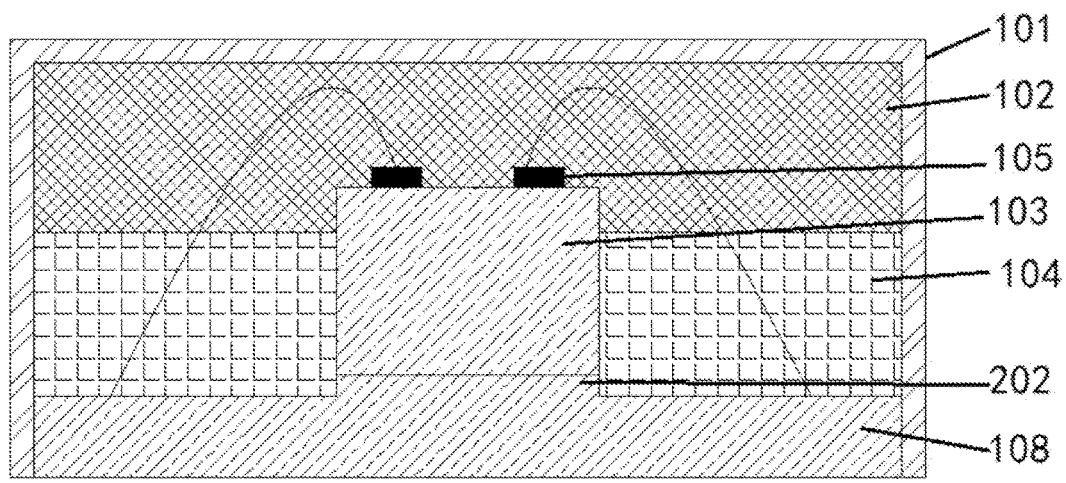
FIG. 2 is a cross-sectional structural diagram of a light-emitting device using a front-mounted chip in the disclosure.

FIG. 2 is a cross-sectional structural diagram of a light-emitting device using a front-mounted chip in the disclosure.

Compared with the implementation mode of FIG. 1, the light-emitting chip 103 in the implementation mode of the disclosure adopts the front-mounted chip, and the electrode 105 of the front-mounted chip is arranged at the top. In specific implementation, the bottom surface of the light-emitting chip 103 is attached to the substrate 108, and the side surface of the light-emitting chip 103 located below the reference surface is covered by the first light-transmitting layer 104.

Similar to the reason of arranging the electrode boss 107, the substrate 108 bulges at the position corresponding to the light-emitting chip 103 to form a boss, and the bottom surface of the light-emitting chip 103 is attached to the boss. For the sake of distinguishing, the boss in the implementation mode of the disclosure is named as a chip boss 202.

Figure 3:
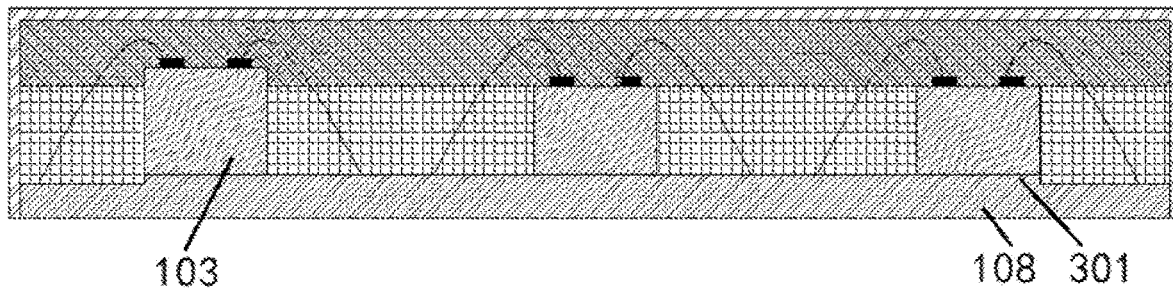
FIG. 3 is a cross-sectional structural diagram of a light-emitting device using a plurality of front-mounted chips in the disclosure.

FIG. 3 is a cross-sectional structural diagram of a light-emitting device using a plurality of front-mounted chips in the disclosure.

In specific implementation, more than two light-emitting chips 103 may be arranged in one light-emitting device. In specific implementation, all the light-emitting chips 103 share one layer of the first light-transmitting layer 104 and one layer of the second light-transmitting layer 102. In the implementation mode of the disclosure, descriptions are made by taking the type of the light-emitting chip 103 being the front-mounted chip as an example.

Each light-emitting chip 103 is arranged based on the implementation mode shown in FIG. 2. In order to reduce the processing difficulty, the chip bosses on the substrate 108 may be integrated into an integral boss 301 to meet the height improvement requirement of all the light-emitting chips 103.

Specifically, aiming at the problem that the heights of the light-emitting chips 103 are not completely consistent, when the heights of the light-emitting chips 103 in one light-emitting device are not completely the same, the height of the first light-transmitting layer is not higher than the top surface of the light-emitting chip 103 with the lowest height in the light-emitting device.

Correspondingly, the disclosure also provides a displayer, which includes any light-emitting device described above.

In conclusion, the disclosure provides a light-emitting device and a displayer. The light-emitting device ensures the light-emitting intensity of the light-emitting chip as much as possible, and has good comprehensive performance while reducing the light crosstalk of the light-emitting device and improving the contrast of the light-emitting device through the arrangement of the two light-transmitting layers and the difference arrangement of the light transmittance of the two light-transmitting layers. The nano coating and the boss structure are arranged so that the anti-impurity-intrusion performance of the light-emitting device can be ensured, and the service life of the light-emitting device is improved. The displayer using the light-emitting device has the advantages of high contrast, high resolution, high brightness, etc.

In addition to the aforementioned light-emitting device and displayer, the disclosure further provides a description of a module processing method aspect.

Figure 4:
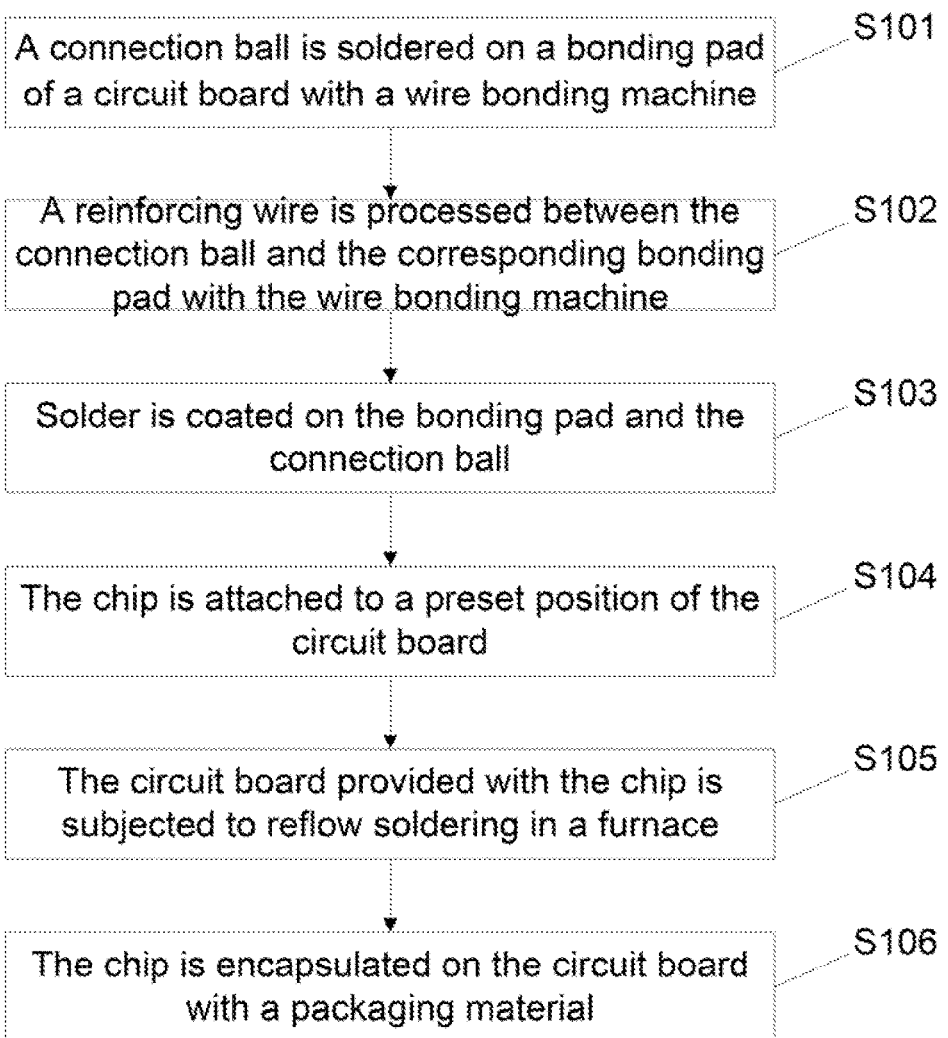
FIG. 4 is a flowchart of a module processing method according to an embodiment of the disclosure.

FIG. 4 is a flowchart of a module processing method according to an implementation mode of the disclosure.

Specifically, the module processing method provided in the embodiment of the disclosure includes the following operations.

At S101, a connection ball 3 is soldered on a bonding pad 2 of a circuit board 1 with a wire bonding machine.

Figure 5:
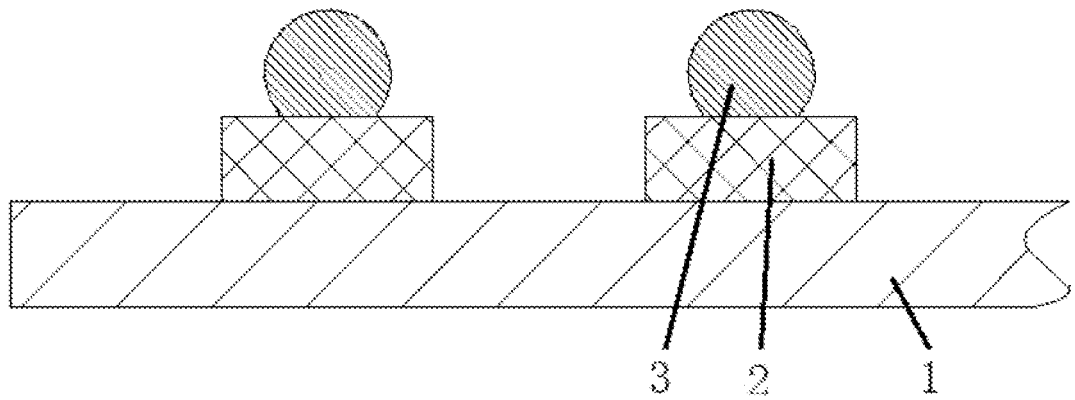
FIG. 5 is a schematic structural diagram of a semi-finished module after soldering a connection ball according to an embodiment of the disclosure.

FIG. 5 is a schematic structural diagram of a semi-finished module after soldering a connection ball.

Specifically, the original function of the wire bonding machine is to bond wires between the light-emitting chip after die bonding and the corresponding bonding pad on the circuit board. In the embodiment of the disclosure, the ball burning function of the wire bonding machine is mainly used.

Specifically, the circuit board 1 is first fixed to a workbench of the wire bonding machine, a preset position (the central position of the bonding pad 2) of the circuit board 1 is preheated using the heating function of the wire bonding machine before the connection ball 3 is soldered on the bonding pad 2 of the circuit board 1, so that the temperature of the bonding pad 2 reaches a preset value, the metal ball in a molten state can be well adhered to the bonding pad 2, and sufficient bonding force is maintained between the connection ball 3 formed after curing and the bonding pad 2.

Then, a metal wire is sintered into a spherical metal ball through a porcelain nozzle of the wire bonding machine, and the metal wire may choose a gold wire, a silver wire, a copper wire and another wire. In specific implementation, after the metal wire with a preset length extends out of the porcelain nozzle of the wire bonding machine, the current is applied to the head of the porcelain nozzle to ignite, and the temperature rises instantly to melt the metal wire. Under the action of intermolecular attraction, the molten metal aggregates into a ball. It is to be noted that the structural shape of the metal ball formed by aggregation of metal in the molten state is close to or equal to a spherical structure, and it will be deformed by the porcelain nozzle in the subsequent molding process of the connection ball 3. The connection ball 3 described in the embodiment of the disclosure is only used to name the related structure, and does not mean that the structure has an ideal spherical structure.

Then, the metal wire and the metal ball (the connection ball 3) at the end of the metal wire are pulled to a designated position above the bonding pad 2 position through the porcelain nozzle. Afterwards, the porcelain nozzle is pressed down to bond the metal ball to the preheated bonding pad 2, so as to ensure sufficient bonding force between the connection ball 3 formed after curing of the metal ball and the bonding pad 2. Since pressing down of the porcelain nozzle gives certain pressure to the metal ball, and the metal ball will not be cured immediately on the preheated bonding pad 2, the metal ball will flow on the bonding pad 2 to a certain extent under the influence of the intermolecular force, and the metal ball finally bonded to the bonding pad is an irregular structure with a large bottom area and a slope.

Finally, after the metal ball is bonded to the bonding pad 2, the porcelain nozzle is pressed down to cut off the metal wire connected with the metal ball and sinter the tail end of the metal wire. Therefore, the metal ball on the bonding pad 2 actually presents a flat boss-like shape (an irregular sphere), the top end of the metal ball may be provided with a pulling tip formed after ball burning, and finally the metal ball is cooled and cured to form the connection ball 3.

In an embodiment, the ratio of the maximum cross-sectional area of the connection ball 3 to the area of the bonding pad 2 ranges from [0.105, 0.655]. Within this range, enough space may be reserved to ensure processing of the reinforcing wire and coating of the solder, and the bonding force between the light-emitting chip and the circuit board is enabled to be the best.

Specifically, the module processing method in the embodiment of the disclosure is to solder the connection ball 3 on the bonding pad 2 of the circuit board 1 through the conversion of the wire bonding machine equipment. On the one hand, the connection ball 3 is arranged so that a fixed support is provided for the solder 106, which plays a supporting role for the solder 106 and can prevent the solder 106 from collapsing. On the one hand, the area of the bonding pad 2 for the solder 106 to attach and adsorb is increased, and the bonding force between the solder 106 and the bonding pad 2 is increased. On the other hand, the distance from the inside of the solder 106 to the surface of the solder 106 is reduced, so that the difficulty of volatilization of solder flux in the reflow soldering process is reduced, voids in the solder 106 are reduced, and the bonding force between the light-emitting chip 103 and the circuit board 1 is improved.

At S102, a reinforcing wire 4 is processed between the connection ball 3 and the corresponding bonding pad 2 with the wire bonding machine.

Figure 6:
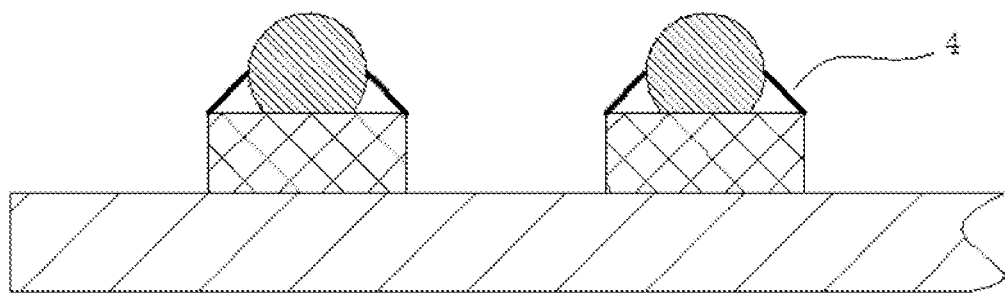
FIG. 6 is a schematic structural diagram of a semi-finished module after processing a reinforcing wire according to an embodiment of the disclosure.

FIG. 6 is a schematic structural diagram of a semi-finished module after processing a reinforcing wire.

This step is an optional implementation step. Specifically, in order to further strengthen the bonding performance between the connection ball 3 and the bonding pad 2, the embodiment of the disclosure also processes the reinforcing wire 4 between the connection ball 3 and the corresponding bonding pad 2. Specifically, on the one hand, the reinforcing wire 4 is arranged so that the bonding between the connection ball 3 and the bonding pad 2 may be further strengthened. On the other hand, when the solder 106 is coated, through the three-dimensional distribution of the reinforcing wire 4 in the space, a fixed point is provided for the solder 106 in a space area, which may further improve the bonding force between the circuit board 1 and the light-emitting chip 103. Specifically, the formation of the reinforcing wire 4 may also be implemented through the wire bonding machine.

Optionally, after the head of the metal wire is connected to the connection ball 3 by the porcelain nozzle of the wire bonding machine, the metal wire is driven to move by the porcelain nozzle and the metal wire is connected to the corresponding bonding pad 2 for cutting-off to form the reinforcing wire 4 as required.

Or, after the head of the metal wire is connected to the bonding pad 2 by the porcelain nozzle of the wire bonding machine, the metal wire is driven to move by the porcelain nozzle and the metal wire is connected to the corresponding connection ball 3 for cutting-off to form the reinforcing wire 4 as required.

Optionally, the number of the reinforcing wires 4 is at least two.

In specific implementation, the processing of the reinforcing wire 4 may be combined with the processing of the connection ball 3. After the connection ball 3 is soldered on the bonding pad 2, the metal wire is driven by the porcelain nozzle to form the reinforcing wire 4, and then the metal wire is cut off so as to improve the convenience of implementation.

At S103, the solder 106 is coated on the bonding pad 2 and the connection ball 3.

Figure 7:
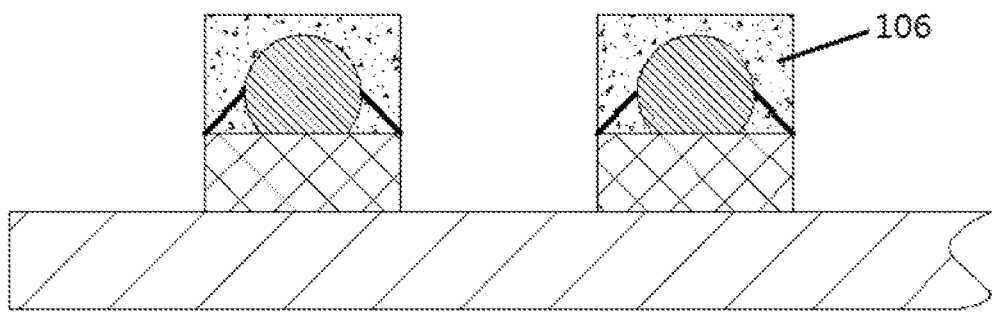
FIG. 7 is a schematic structural diagram of a semi-finished module after coating solder according to an embodiment of the disclosure.

FIG. 7 is a schematic structural diagram of a semi-finished module after coating solder 106.

Specifically, the coating mode of the solder 106 may be steel mesh printing, injection coating or separate spot coating, and another mode. Preferably, the coating mode of the solder 106 is steel mesh printing. In specific implementation, a steel mesh with a preset thickness is placed on the circuit board 1, and the solder 106 is coated and scraped on the surface of the steel mesh. The solder 106 fills a reserved hole of the steel mesh corresponding to the bonding pad 2, and the steel mesh is taken away to finish the coating of the solder 106. Steel mesh printing can not only control the amount of the solder 106, but also reduce the difficulty of the solder 106 coating process. Specifically, the material of the solder 106 includes an alloy composed of at least one of tin (Sn), silver (Ag), copper (Cu), lead (Pb), bismuth (Bi), antimony (Sb), indium (In), germanium (Ge) and nickel (Ni). Preferably, the material of the solder 106 at least includes an alloy composed of elements of tin (Sn), silver (Ag) and copper (Cu). In specific implementation, since the bonding pad 2, the connection ball 3 and the electrode 105 of the light-emitting chip 103 are all metal materials, bonding parts of the solder 106 with the bonding pad 2, the connection ball 3 and the electrode 105 of the light-emitting chip 103 will form a binary alloy, a ternary alloy, a quaternary alloy or a multi-element alloy after furnace reflow soldering, thus ensuring the bonding reliability of the solder 106 with the bonding pad 2, the connection ball 3 and the electrode 105.

At S104, the light-emitting chip 103 is attached to a preset position of the circuit board 1.

Figure 8:
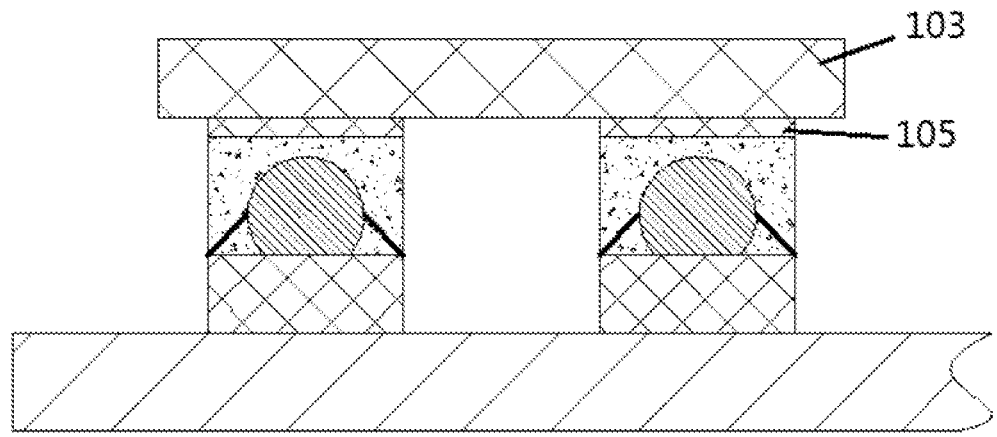
FIG. 8 is a first implementation structural diagram of a semi-finished module after mounting a light-emitting chip according to an embodiment of the disclosure.

FIG. 8 is a first implementation structural diagram of a semi-finished module after mounting a light-emitting chip.

Specifically, the light-emitting chip 103 is placed at the preset position of the circuit board 1 coated with the solder 106 (the position of the preset bonding pad 2) to implement the bonding between the light-emitting chip 103 and the circuit board 1.

Optionally, since the periphery of the electrode 105 of the light-emitting chip 103 is provided with the metal layer 8 and the insulating layer 9, correspondingly, the semi-finished module after mounting the light-emitting chip 103 has a certain structural difference.

Figure 9:
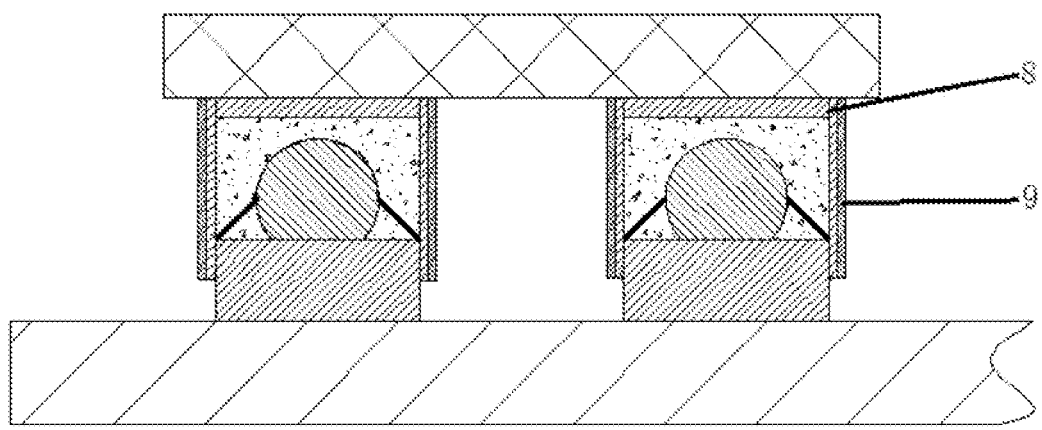
FIG. 9 is a second implementation structural diagram of a semi-finished module after mounting a light-emitting chip according to an embodiment of the disclosure.

FIG. 9 is a second implementation structural diagram of a semi-finished module after mounting a light-emitting chip.

Specifically, the periphery of the electrode 105 of the light-emitting chip 103 is provided with the metal layer 8 and the insulating layer 9. The metal layer 8 is arranged on the peripheral side of the electrode 105 of the light-emitting chip 103 in a surrounding mode and contacts the electrode 105 of the light-emitting chip 103, and the insulating layer 9 is arranged on the outer side wall of the metal layer 8 in a surrounding mode. Furthermore, the arrangement height of the metal layer 8 is higher than the height of the electrode 105 of the light-emitting chip 103, and the arrangement height of the metal layer 8 is flush with the arrangement height of the insulating layer 9. Furthermore, the metal layer 8 surrounds the corresponding bonding pad 2. In specific implementation, after the light-emitting chip 103 is attached to the preset position of the circuit board 1 (the position of the preset pad 2), the metal layer 8 surrounds the corresponding bonding pad 2, and correspondingly, the metal layer 8 surrounds the corresponding connection ball 3 and the solder 106. Through the arrangement of the metal layer 8 and the insulating layer 9, on the one hand, a mutually matched positioning structure with the bonding pad 2 can be formed, thus improving the accuracy of the bonding position of the light-emitting chip 103; and on the other hand, the solder 106 can also be surrounded to prevent the solder 106 from overflowing, thus reducing the risk of short circuit caused by overflowing of the solder 106.

At S105, the circuit board 1 provided with the light-emitting chip 103 is subjected to reflow soldering in a furnace.

Specifically, the purpose of this step is to bond the electrode 105 of the light-emitting chip 103, the connection ball 3, the solder 106 and the bonding pad 2, and implement electrical connection between the light-emitting chip 103 and the circuit board 1.

Figure 10:
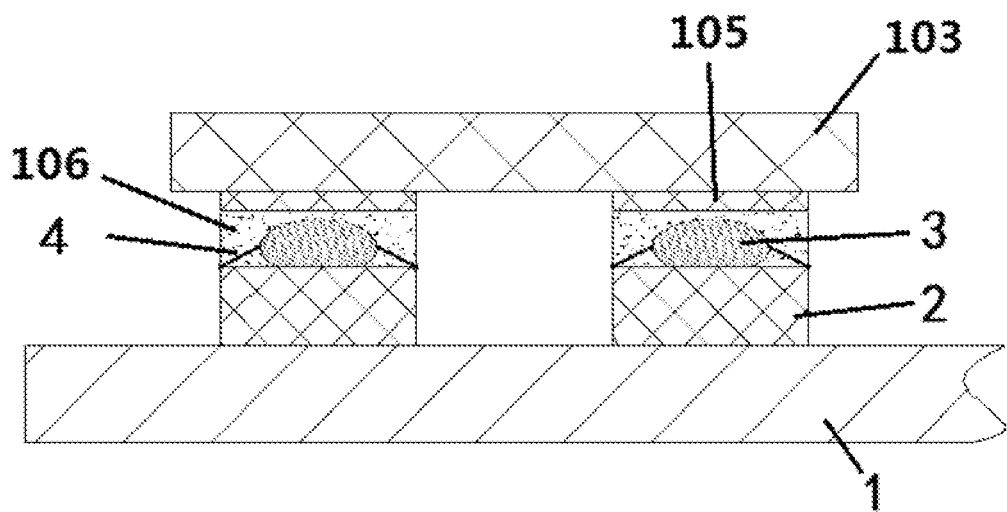
FIG. 10 is a first implementation structural diagram of a semi-finished module after reflow soldering according to an embodiment of the disclosure.
Figure 11:
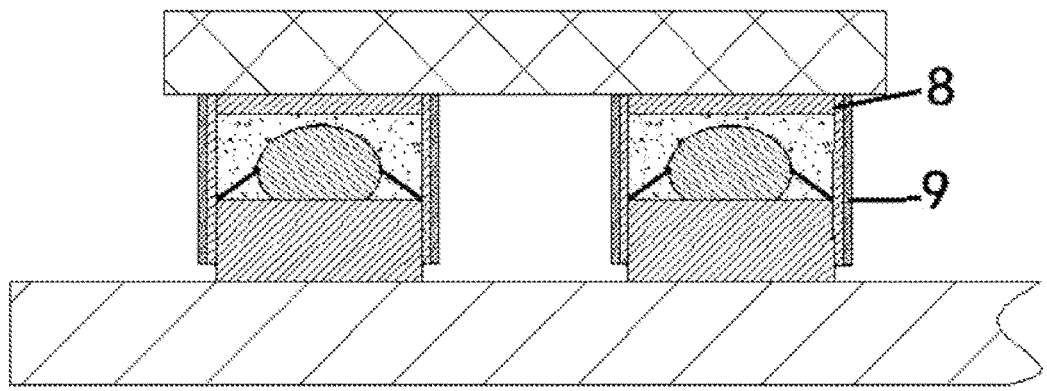
FIG. 11 is a second implementation structural diagram of a semi-finished module after reflow soldering according to an embodiment of the disclosure.

Specifically, corresponding to the first implementation structure of the semi-finished module after mounting the light-emitting chip corresponding to FIG. 8, FIG. 10 is a first implementation structural diagram of a semi-finished module after reflow soldering according to an embodiment of the disclosure. Corresponding to a second implementation structure of the semi-finished module after mounting the light-emitting chip corresponding to FIG. 9, FIG. 11 is a second implementation structural diagram of a semi-finished module after reflow soldering according to an embodiment of the disclosure.

It is to be noted that, in specific implementation, the solder 106 will be deformed to a certain extent in both the light-emitting chip bonding process and the furnace reflow soldering process, and the structure of the solder 106 in the embodiment of the disclosure is only presented as a structure in the ideal state rather than a structure actually formed by the solder 106.

At S106, the light-emitting chip 103 is encapsulated on the circuit board 1 with the packaging material 10, and the packaging material 10, the light-emitting chip 103 and the circuit board 1 form a module.

Specifically, the packaging material 10 is used to protect the light-emitting chip on the one hand, and to form a module outline structure that meets the requirement on the other hand. Optionally, the packaging material 10 may be epoxy resin, silicone resin and another material. After being packaged with the packaging material 10, all the components in the aforementioned processing steps are combined to form the module as required.

Figure 12:
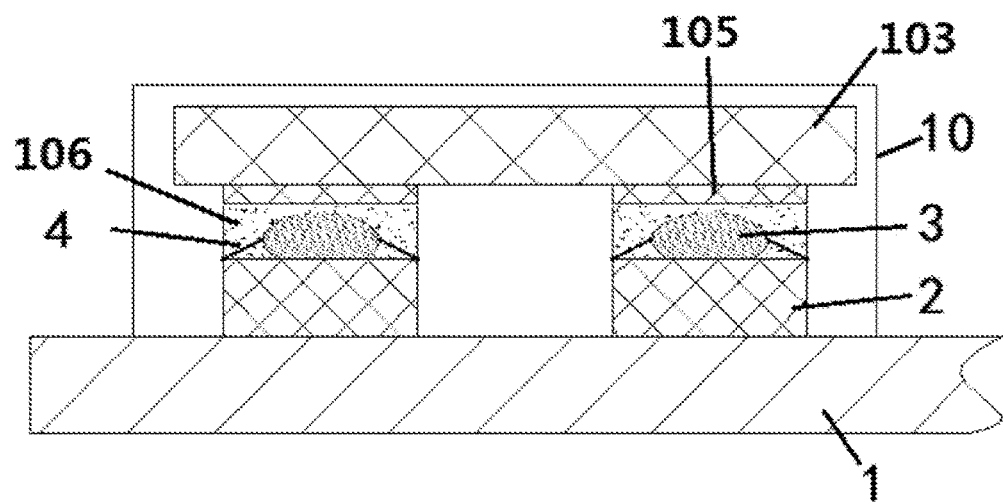
FIG. 12 is a first implementation structural diagram of a finished module after encapsulating according to an embodiment of the disclosure.
Figure 13:
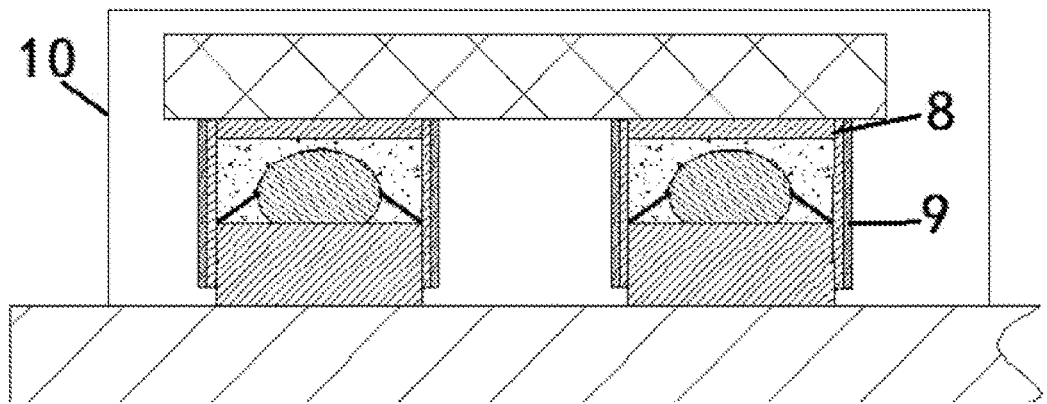
FIG. 13 is a second implementation structural diagram of a finished module after encapsulating according to an embodiment of the disclosure.

Corresponding to the two implementation modes of FIG. 10 and FIG. 11, correspondingly, the module has two implementation structures. FIG. 12 is a first implementation structural diagram of a finished module after encapsulating according to an embodiment of the disclosure. FIG. 13 is a second implementation structural diagram of a finished module after encapsulating according to an embodiment of the disclosure.

It is to be noted that, for the sake of clarity of view, only one light-emitting chip is shown in the drawing of the module processing method in the embodiment of the disclosure. In specific implementation, the number of the light-emitting chips in the module may also be multiple. Correspondingly, the packaging material may independently package each light-emitting chip or form an integral package for multiple light-emitting chips.

Figure 14:
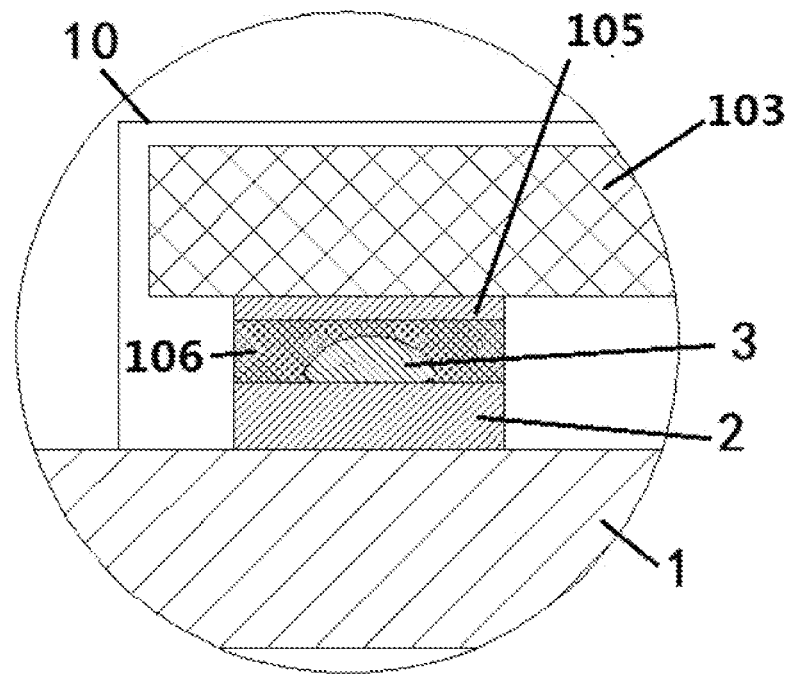
FIG. 14 illustrates a partial structural schematic diagram of a first implementation structure of a module according to an embodiment of the disclosure.

FIG. 14 illustrates a partial structural schematic diagram of a first implementation structure of a module according to an embodiment of the disclosure.

Correspondingly, the disclosure further provides a module. The module includes a circuit board 1, a light-emitting chip 103 and a packaging material 10. The circuit board 1 is provided with a bonding pad 2, and the light-emitting chip 103 is provided with an electrode 105. The electrode 105 is bonded to the corresponding bonding pad 2 based on a connection structure. The connection structure includes a connection ball 3 and solder 106. The connection ball 3 is bonded to the bonding pad 2, the solder 106 covers the connection ball 3 and the bonding pad 2, and the electrode 105 is bonded with the corresponding connection ball 3 and the bonding pad 2 through the solder 106. The packaging material 10 covers the light-emitting chip 103 and encapsulates the light-emitting chip 103 on the circuit board 1.

Specifically, before the encapsulating is performed using the packaging material, thrust tests on the modules with and without the connection ball soldered are performed through comparative experiments. Under the same test conditions, the thrust value of a sample with the connection ball soldered is 27.5% higher than that of a sample without the connection ball soldered, and the control variable of the two samples is whether to solder the connection ball or not. Specifically, according to different size of the connection balls, the thrust values in the thrust tests will be different to some extent, but the test results are all higher than that of the module without the connection ball structure soldered.

Figure 15:
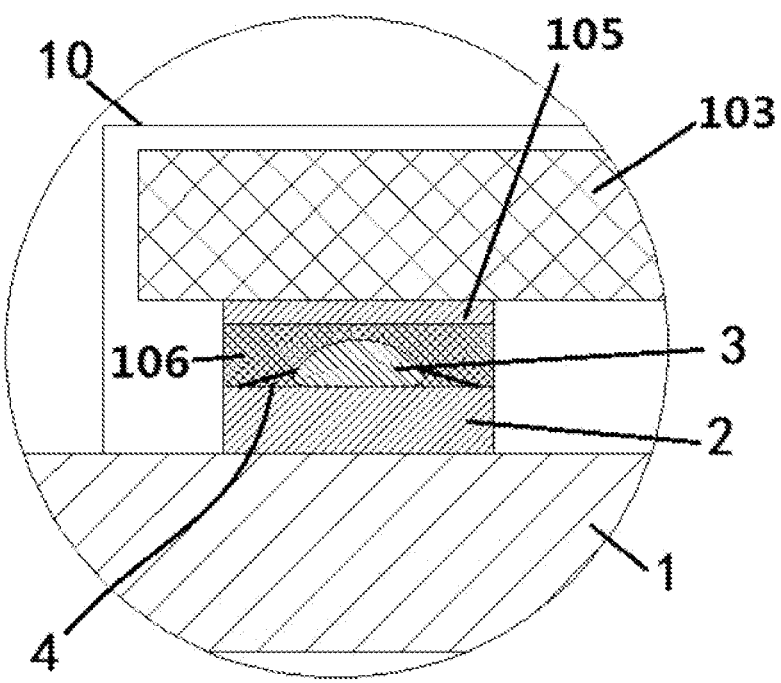
FIG. 15 illustrates a partial structural schematic diagram of a second implementation structure of a module according to an embodiment of the disclosure.

FIG. 15 illustrates a partial structural schematic diagram of a second implementation structure of a module according to an embodiment of the disclosure.

On the basis of the first implementation structure of the module, in the second implementation structure of the module, a reinforcing wire 4 is additionally arranged between the bonding pad 2 and the corresponding connection ball 3, which can further improve the bonding between the connection ball 3 and the bonding pad 2 and effectively fix the solder 106.

Specifically, according to the aforementioned description with respect to the module processing method, the structure of the module may be improved correspondingly. For example, the reinforcing wire is arranged between the connection ball and the corresponding bonding pad, the metal layer and the insulating layer are arranged on the periphery of the electrode, etc. The module structure disclosed in the embodiment of the disclosure does not explain all the module structures in detail. It is to be noted that the arrangement structures of the metal layer and the insulating layer may refer to the aforementioned description.

The connection ball is arranged on the bonding pad, so that the collapse and voids of the solder are reduced, and the bonding force between the light-emitting chip and the circuit board is improved. The reinforcing wire is arranged between the connection ball and the bonding pad, which on the one hand improves the bonding stability between the connection ball and the bonding pad, and on the other hand provides fixing points for the solder in the space area, further improving the bonding force between the light-emitting chip and the circuit board. The equipment used in the module processing method is all existing equipment. By reasonably utilizing the processing characteristics of each equipment and the conversion and expansion functions of the equipment, the practical use of the equipment is broadened, the production cost of the module is reduced under the condition of meeting the production requirements, and good economy is achieved. The device obtained by cutting the module according to requirements may be flexibly processed according to the actual requirements, and has good processing convenience.

Above, one light-emitting device and one displayer provided in the implementation modes of the disclosure are introduced in detail. Specific cases are used in the disclosure to explain the principle and implementation modes of the disclosure. The descriptions of the above embodiments are only for helping to understand the method and core idea of the disclosure. Meanwhile, for those of ordinary skill in the art, there will be variations in the specific implementation mode and disclosure scope according to the idea of the disclosure. In conclusion, the content of the specification shall not be understood as a limitation to the disclosure.

What is claimed is:

1. A light-emitting device, comprising a substrate and a light-emitting chip, the light-emitting chip is arranged on the substrate in a bonding mode, wherein the light-emitting device further comprises a first light-transmitting layer, a second light-transmitting layer and a nano coating, wherein a light transmittance of the second light-transmitting layer is greater than a light transmittance of the first light-transmitting layer;

a reference surface corresponding to the light-emitting chip is arranged above the substrate, the reference surface is higher than a bottom surface of the light-emitting chip and the reference surface is not higher than a top surface of the light-emitting chip;

an exposed surface of the light-emitting chip is divided into an upper surface and a lower surface based on the reference surface;

the lower surface is covered by the first light-transmitting layer, and the upper surface is covered by the second light-transmitting layer;

the first light-transmitting layer and the second light-transmitting layer are is closely arranged at a position of the reference surface; and the nano coating covering an outer surface of the first light-transmitting layer, an outer surface of the second light-transmitting layer and a side surface of the substrate;

the light-emitting device is formed by cutting a module, the module comprising a circuit board, a plurality of the light-emitting chips and a packaging material, wherein the substrate of the light-emitting device is at least a part of the circuit board, the light-emitting chip of the light-emitting device is at least one of a plurality of the light-emitting chips of the module, and the first light-transmitting layer, the second light-transmitting layer and the nano coating of the light-emitting device is at least a part of the packaging material of the module;

the circuit board is provided with a bonding pad, the light-emitting chip is provided with an electrode;

the electrode is bonded to a corresponding bonding pad based on a connection structure;

the connection structure comprising a connection ball and solder, the connection ball is bonded to the bonding pad, the solder covering the connection ball and the bonding pad, and the electrode is bonded with a corresponding connection ball and the bonding pad through the solder; and the packaging material covering the light-emitting chip and encapsulating the light-emitting chip on the circuit board;

the connection structure further comprises a reinforcing wire, both ends of the reinforcing wire are respectively bonded to the corresponding connection ball and the bonding pad.

2. The light-emitting device according to claim 1, wherein a thickness of the nano coating ranges from [150 nm, 30000 nm].

3. The light-emitting device according to claim 1, wherein a roughness value of the nano coating ranges from [2.7, 3.2].

4. The light-emitting device according to claim 1, wherein the light-emitting chip is a flip-chip, the electrode located at a bottom of the light-emitting chip, the light-emitting chip is bonded to the substrate based on a corresponding electrode, and the lower surface comprising the bottom surface of the light-emitting chip and a side surface, located below the reference surface, of the light-emitting chip.

5. The light-emitting device according to claim 4, wherein when the light-emitting chip is the flip-chip, the substrate bulges at a position corresponding to the electrode to form a boss, the electrode is bonded to the corresponding boss.

6. The light-emitting device according to claim 4, wherein when the light-emitting chip is the front-mounted chip, the substrate bulges at a position corresponding to the light-emitting chip to form a boss, the bottom surface of the light-emitting chip is attached to the boss.

7. The light-emitting device according to claim 1, wherein the number of the light-emitting chips is more than two, all the light-emitting chips sharing one layer of the first light-transmitting layer, and/or all the light-emitting chips sharing one layer of the second light-transmitting layer.

8. The light-emitting device according to claim 7, wherein heights of the light-emitting chips in the light-emitting device are not exactly the same, a height of the first light-transmitting layer is not higher than the top surface of the light-emitting chip with the lowest height in the light-emitting device.

9. The light-emitting device according to claim 1, wherein a height of the light-emitting chip is H, a height of the reference surface corresponding to the light-emitting chip is h, wherein H≥h≥3H/4.

10. The light-emitting device according to claim 1, wherein a periphery of the electrode of the light-emitting chip is provided with a metal layer and an insulating layer; and the metal layer is arranged on a peripheral side of the electrode of the light-emitting chip in a surrounding mode and contacting the electrode of the light-emitting chip, and the insulating layer is arranged on an outer side wall of the metal layer in a surrounding mode.

11. The light-emitting device according to claim 10, wherein an arrangement height of the metal layer is higher than an arrangement height of the electrode of the light-emitting chip, the arrangement height of the metal layer is flush with an arrangement height of the insulating layer.

12. The light-emitting device according to claim 10, wherein the metal layer surrounds the corresponding bonding pad.

13. The light-emitting device according to claim 1, wherein a ratio of the maximum cross-sectional area of the connection ball to an area of the bonding pad ranges from [0.105, 0.655].

14. The light-emitting device according to claim 1, wherein the number of the reinforcing wires is at least two.

15. A displayer, comprising the light-emitting device according to claim 1.

16. The displayer according to claim 15, wherein a thickness of the nano coating ranges from [150 nm, 30000 nm].

17. The displayer according to claim 15, wherein a roughness value of the nano coating ranges from [2.7, 3.2].

\* \* \* \* \*